United States Patent
Wann

(10) Patent No.: US 6,653,686 B2
(45) Date of Patent: *Nov. 25, 2003

(54) STRUCTURE AND METHOD OF CONTROLLING SHORT-CHANNEL EFFECT OF VERY SHORT CHANNEL MOSFET

(75) Inventor: Hsing-Jen Wann, Briarcliff Manor, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/114,502

(22) Filed: Jul. 13, 1998

(65) Prior Publication Data

US 2002/0056873 A1 May 16, 2002

(51) Int. Cl.⁷ ................................................ H01L 29/72
(52) U.S. Cl. ..................... 257/335; 257/305; 257/346; 257/387; 257/404; 257/408; 257/409
(58) Field of Search ............................... 257/335, 346, 257/305, 387, 404, 408, 409

(56) References Cited

U.S. PATENT DOCUMENTS

| | | |
|---|---|---|
| 4,857,141 A | 8/1989 | Abe et al. |
| 5,118,636 A | 6/1992 | Hosaka |
| 5,199,994 A | 4/1993 | Aoki |
| 5,719,430 A * | 2/1998 | Goto .................. 257/403 |

* cited by examiner

*Primary Examiner*—Edward Wojciechowicz
(74) *Attorney, Agent, or Firm*—McGinn & Gibb, PLLC; Wan Yee Cheung, Esq.

(57) ABSTRACT

A semiconductor device comprising a gate having an approximately 0.05 μm channel length, an oxide layer below the gate, a self-aligned compensation implant below the oxide layer, a halo implant surrounding the self-aligned compensation implant below the oxide layer; and gate and drain regions on opposite sides of the halo implant and below the oxide layer.

20 Claims, 6 Drawing Sheets

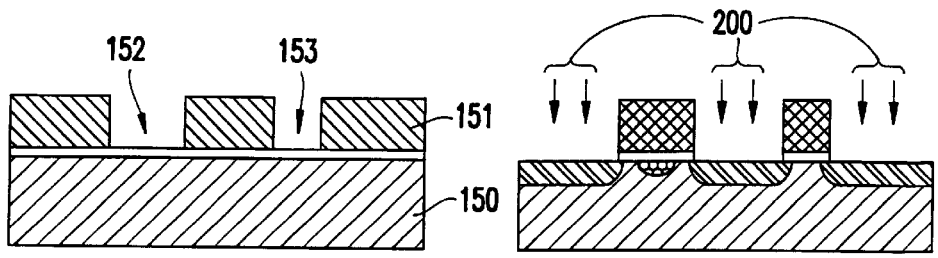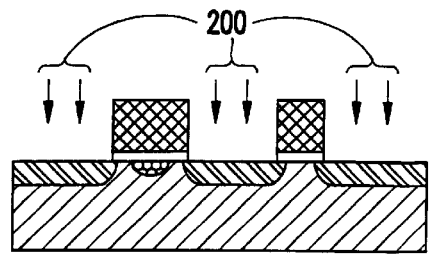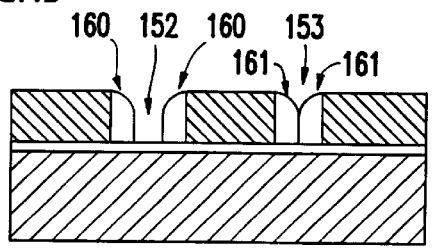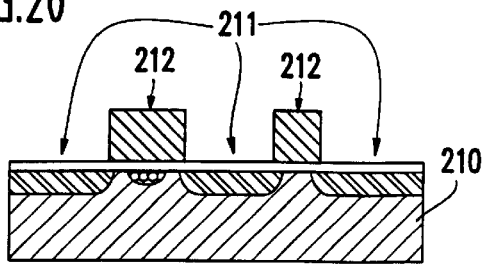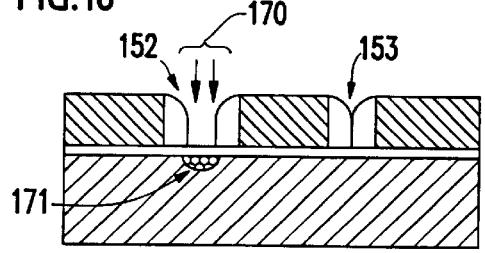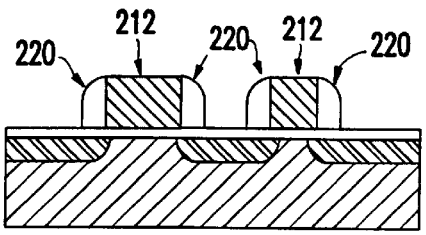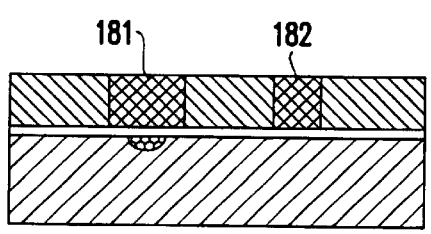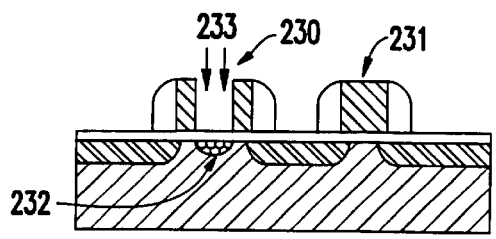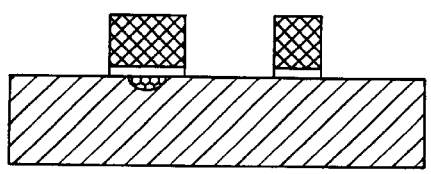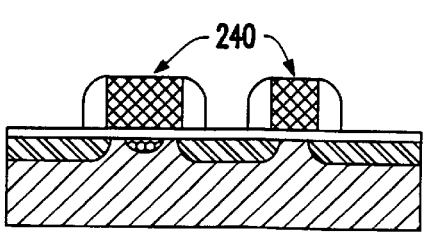

STRUCTURE AND METHOD OF CONTROLLING SHORT-CHANNEL EFFECT OF VERY SHORT CHANNEL MOSFET

BACKGROUND OF THE INVENTION

1. Field of the Invention

The present invention generally relates to doped semiconductor transistors and more particularly to doped short-channel devices which have channel lengths less than 0.05 μm and which maintain acceptable threshold voltages, and methods of making such devices.

2. Description of the Related Art

Conventional metal oxide semiconductor field effect transistor (MOSFET) device structures are continuously being reduced in size to increase processing speed and decrease manufacturing cost. Conventional methods of reducing the size of MOSFET devices shrink all the dimensions of the device proportionally.

However, as the channel length in the MOSFET is reduced to increase speed, a "short-channel" effect often occurs which severely degrades the device characteristics. More specifically, the short channel effect is an undesirable increase in the threshold voltage of the gate as the channel length is reduced.

Therefore, there is a conventional need for a method and structure which overcomes the short channel effect and allows MOSFET structures having channel lengths of approximately 0.05 μm to produce consistent threshold voltages.

SUMMARY OF THE INVENTION

It is, therefore, an object of the present invention to provide a structure and method for a doping profile for controlling short-channel devices having channel lengths down below 0.05 μm, and the methods of making such profiles.

More specifically, the invention is a semiconductor device comprising a gate, an oxide layer below the gate, a self-aligned compensation implant below the oxide layer, a halo implant surrounding the self-aligned compensation implant below the oxide layer, and gate and drain regions on opposite sides of the halo implant and below the oxide layer. The self-aligned compensation implant reduces a threshold voltage of the semiconductor device and has a doping concentration for controlling a threshold voltage reduction of the semiconductor device that varies depending upon a channel length of the semiconductor device.

The invention also includes method of manufacturing a semiconductor device comprising steps of successively depositing an oxide layer and a dielectric layer on a semiconductor substrate, forming a channel in the oxide layer and the dielectric layer, forming spacers in the channel, implanting an impurity in the semiconductor substrate through the channel to form a self-aligned compensation implant in the semiconductor substrate, depositing an oxide layer in the channel on the semiconductor substrate, filling the channel with a conductive material to form a gate over the oxide layer, removing all of the dielectric layer, removing a portion of the oxide layer such that the oxide layer remains between the gate and the semiconductor substrate, and doping areas of the semiconductor substrate adjacent the gate to form a halo implant and source and drain regions in the semiconductor substrate.

The implanting step further comprises a step of varying a doping concentration of the self-aligned compensation implant for controlling a threshold voltage reduction of the semiconductor device. The step of varying a doping concentration of the self-aligned compensation implant is dependent upon a channel length of the semiconductor device.

The invention also includes a method of manufacturing a semiconductor device comprising steps of successively depositing an oxide layer and a dielectric layer on a semiconductor substrate, forming a channel in the oxide layer and the dielectric layer, depositing an oxide layer in the channel on the semiconductor substrate, partially filling the channel with a conductive material, implanting an impurity in the semiconductor substrate through the conductive material and the oxide layer in the channel to form a self-aligned compensation implant in the semiconductor substrate, completely filling the channel with the conductive material to form a gate over the oxide layer, removing all of the dielectric layer, removing a portion of the oxide layer such that the oxide layer remains between the gate and the semiconductor substrate, and doping areas of the semiconductor substrate adjacent the gate to form a halo implant and source and drain regions in the semiconductor substrate.

Once again, the implanting step further comprises a step of varying a doping concentration of the self-aligned compensation implant for controlling a threshold voltage reduction of the semiconductor device and the step of varying a doping concentration of the self-aligned compensation implant is dependent upon a channel length of the semiconductor device.

The invention also includes a method of manufacturing a semiconductor device comprising steps of forming a sacrificial mask over a gate area of a substrate, forming spacers adjacent the sacrificial mask, forming an opening in the sacrificial mask, implanting an impurity in the semiconductor substrate through the opening in the sacrificial mask to form a self-aligned compensation implant in the semiconductor substrate, removing the sacrificial mask, depositing an oxide layer between the spacers on the semiconductor substrate, forming a gate between the spacers and over the oxide layer, and doping areas of the semiconductor substrate adjacent the gate to form a halo implant and source and drain regions in the semiconductor substrate.

Again, the implanting step further comprises a step of varying a doping concentration of the self-aligned compensation implant the step of varying a doping concentration of the self-aligned compensation implant is dependent upon a channel length of the semiconductor device.

BRIEF DESCRIPTION OF THE DRAWINGS

FIG. 15 is a schematic diagram showing a cross-sectional view of a stage of development of a semiconductor device;

FIG. 16 is a schematic diagram showing a cross-sectional view of a stage of development of a semiconductor device;

FIG. 17 is a schematic diagram showing a cross-sectional view of a stage of development of a semiconductor device;

FIG. 18 is a schematic diagram showing a cross-sectional view of a stage of development of a semiconductor device;

FIG. 19 is a schematic diagram showing a cross-sectional view of a stage of development of a semiconductor device;

FIG. 20 is a schematic diagram showing a cross-sectional view of a stage of development of a semiconductor device;

FIG. 21 is a schematic diagram showing a cross-sectional view of a stage of development of a semiconductor device;

FIG. 22 is a schematic diagram showing a cross-sectional view of a stage of development of a semiconductor device;

FIG. 23 is a schematic diagram showing a cross-sectional view of a stage of development of a semiconductor device; and FIG. 24 is a schematic diagram showing a cross-sectional view of a stage of development of a semiconductor device.

DETAILED DESCRIPTION OF PREFERRED EMBODIMENTS OF THE INVENTION

Figure 1:
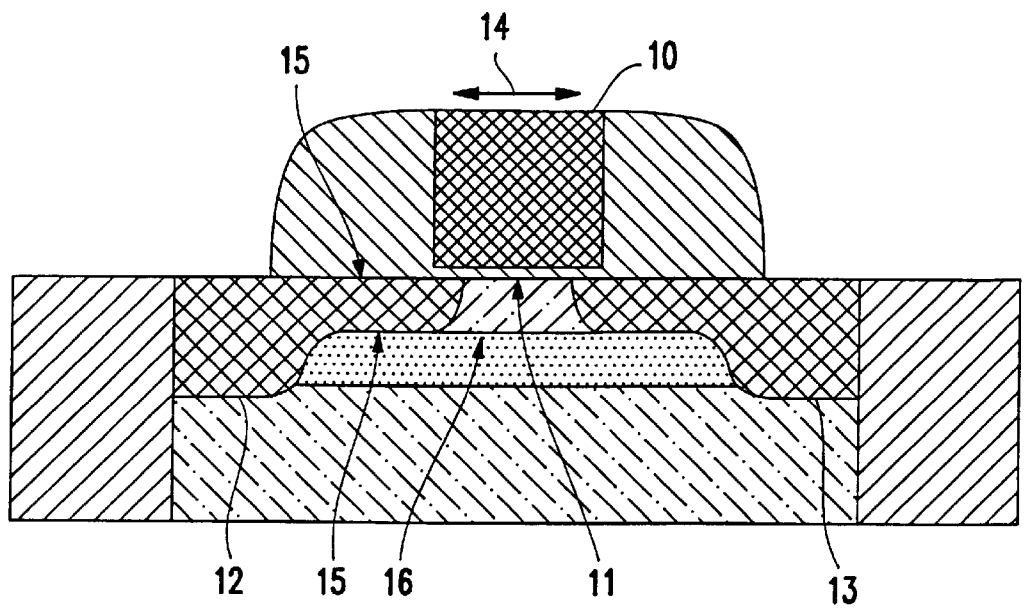
FIG. 1 is a schematic diagram of a cross-sectional view of a semiconductor device.

Referring now to the drawings, and more particularly to FIG. 1, a MOSFET device having a gate 10, gate oxide layer 11, source region 12 and drain region 13 is illustrated. When reducing the size of the MOSFET, the dimension of the oxide thickness 11 and the junction depth 15 can preferably be decreased and the depletion region 16 can preferably be effectively reduced by increasing the substrate doping.

Figure 2:
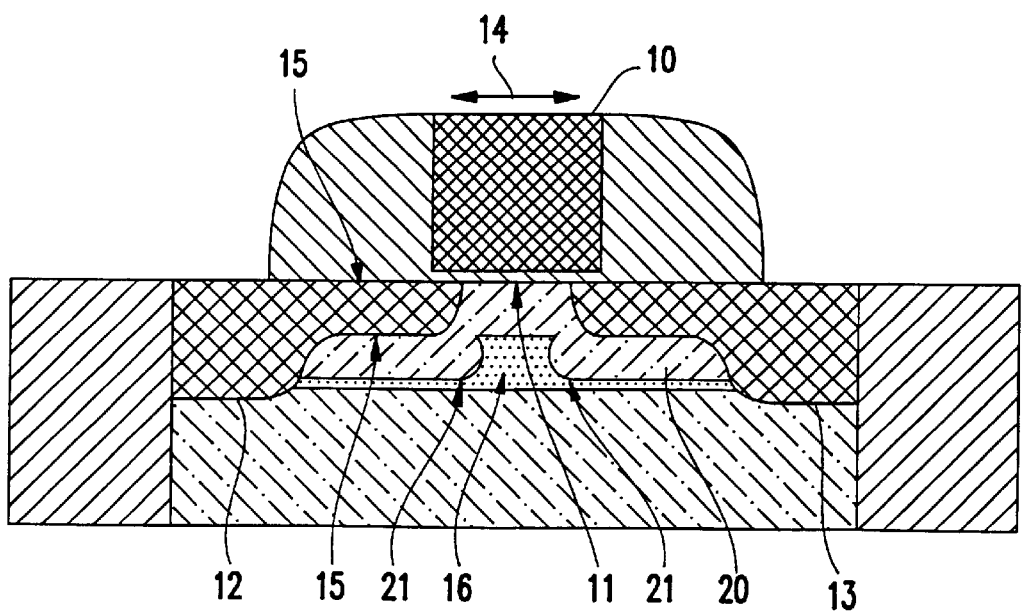
FIG. 2 is a schematic diagram of a cross-sectional view of a semiconductor device.

When the channel length 14 is reduced to 0.1 $\mu$m, a "halo implant" 20, as shown in FIG. 2, can preferably be used to control the short channel effect. As mentioned above, the short channel effect is an undesirable increase in the threshold voltage of the gate 10 as the channel length 14 is reduced. The halo implant 20 is a ring-shaped structure which is positioned between the gate 12 and drain 13 and below the oxide layer 11.

The halo implant 20 reduces the short channel effect by surrounding the source-drain extensions to prevent electrical field line penetration. The halo implant 20 introduces a lateral nonuniformity, which is essential for controlling the short-channel effect and is useful down to channel lengths around 0.08 $\mu$m.

However, at approximately 0.05 $\mu$m, the halo implant 20 begins to reach a limitation in the ability to control the short-channel effect. More specifically, when channel lengths are reduced below 0.05 $\mu$m, the distribution tails 21 of the halo implant 20 tend to be too long, which increases the threshold voltage unacceptably, producing a situation known as "Vt roll-off". Also, the concentration of halo implant 20 can be too high, which causes tunneling leakage current to increase.

The halo implant 20, which has a three-dimensional ring or doughnut-shaped structure, tends to lose the opening or "hole" at the center of the structure when the size of the channel is reduced. In other words, when the channel length is reduced below 0.05 $\mu$m, the inner surfaces of the halo structure may join, due to the lateral distribution tails 21 overlapping, thereby severely altering the threshold voltage (Vt) of the device.

Because of this problem, it is difficult to produce a device having a channel length less than 0.08 $\mu$m (within the normally acceptable range of manufactureable tolerances) and a stable threshold voltage.

Figure 3:
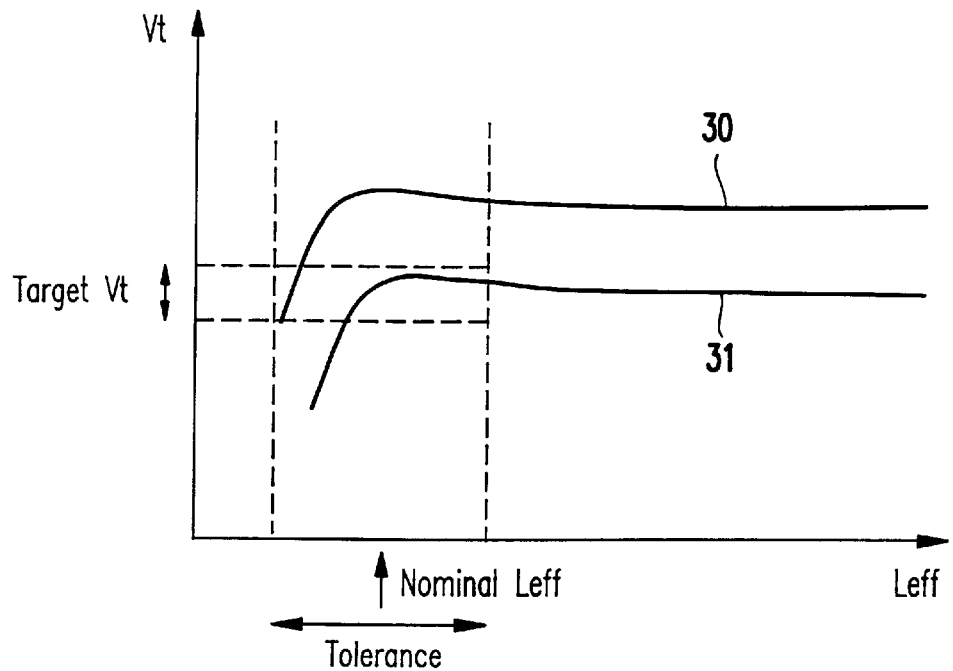
FIG. 3 is a chart showing the relationship between a target threshold voltage and a channel length of a semiconductor device.

This problem is graphically illustrated in FIG. 3. A typical range of manufactureable tolerances of channel lengths is shown on the horizontal axis of FIG. 3. More specifically, FIG. 3 illustrates a mean value for an effective channel length (e.g., nominal leff) which is preferably approximately 0.05 $\mu$m and a tolerance between a worse case long channel length and a worse case short channel length. The tolerance range of channel length results from variations which would be expected in a normal manufacturing process. For example, the tolerance range could be +/0.017 $\mu$m the preferable target channel length of 0.05 $\mu$m.

The vertical axis in FIG. 3 represents the threshold voltage Vt and more specifically shows a target threshold voltage range (Vt) for the device. For example, the target threshold voltage range is preferably 0.35 V+/−0.15 V.

Line 30 represents the threshold voltages of more heavily doped devices and line 31 represents the threshold voltages of lighter doped devices, where each of the devices includes a conventional halo implant.

More specifically, lines 30, 31 illustrate the "short-channel effect" (e.g., threshold voltage roll-off). Line 30 illustrates that only those heavily doped devices which have channel lengths substantially shorter than the standard channel length (e.g., nominal leff) will perform adequately and exhibit the target threshold voltage and that nominal leff and larger channel length devices will have a threshold voltage which is above the target threshold voltage.

Similarly, line 31 illustrates that even if the doping of the devices is changed (e.g., made lighter), not all ranges of channel lengths expected within a given manufacturing tolerance will produce the desired target threshold voltage. Specifically, those devices having a channel length which is less than nominal leff will have a threshold voltage which is below the target threshold voltage and only those devices having a nominal leff and larger channel lengths will have a threshold voltage within the range of target threshold voltages.

Additionally, FIG. 3 illustrates that the longer channel lengths tend to have a higher threshold voltage. The shape of lines 30 and 31 is caused by the tails 21 of the halo implant 20 overlapping partially or completely, as discussed above with respect to FIG. 2. Thus, FIG. 3 illustrates that even if devices having channel lengths less than 0.05 $\mu$m include a halo implant, such devices will not likely produce target threshold voltages (throughout the acceptable channel length tolerance range) regardless of doping concentrations. Thus, the process margin will be very small and the junction leakage will be too high.

Thus, as discussed above, when channel lengths are reduced below 0.05 $\mu$m, the distribution tails of the halos tend to overlap, which increases the threshold voltage unacceptably producing the situation known as "Vt roll-off". The invention reduces the size of the lateral distribution tail of the halo implant so that the distribution tails do not overlap. In order to accomplish this, the invention uses a self-aligned gate compensation implant 42, as shown in FIG. 4, to counteract the short-channel Vt roll-off.

Figure 4:
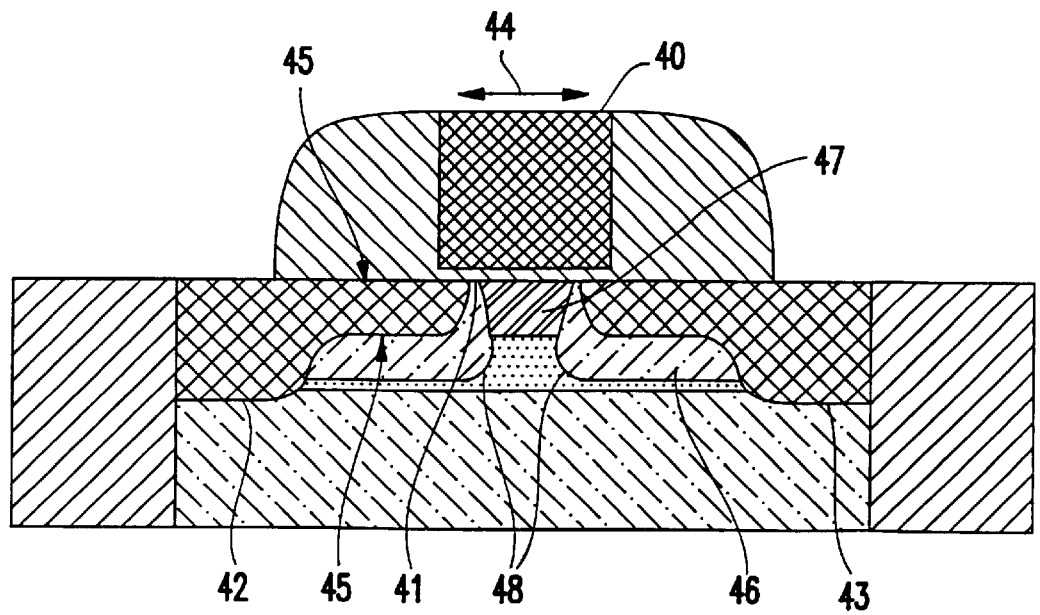
FIG. 4 is a schematic diagram of a cross-sectional view of a semiconductor device.

More specifically, FIG. 4 illustrates a gate 40, a gate oxide layer 41 below the gate 40, a source region 42 and a drain region 43 having a junction depth 45, a channel length 44, a halo implant 46, a compensation implant 47 and lateral distribution tails 48. The compensation implant 47 is positioned below the gate oxide 41 and is surrounded by the halo implant 46. The processing steps used to create the structure illustrated in FIG. 4 are discussed below with respect to FIGS. 6–24.

The compensation implant 47 formed below the gate 40 will reduce the undesirable Vt roll-off. However, a uniform "blanket" compensation implant will equally lower the Vt of MOSFET of all channel lengths. The inventive compensation implant 47 is different than a "blanket" compensation implant because it is self-aligned with the gate 40. By self-aligning the compensation implant 47, the implant dose of the compensation implant 47 will be a function of the gate length 44.

With the self-aligned compensation implant, the compensation dose is lower for a smaller gate length and the threshold voltage reduction is correspondingly lower. For a longer gate length the compensation dose is greater and the threshold voltage is reduced more. In other words, the inventive compensation implant will reduce long channel threshold voltage more than short-channel threshold voltage, and will counteract the Vt roll-off and result in better threshold voltage stability.

As mentioned above with respect to FIG. 3, a longer channel length will have a higher threshold voltage. The inventive compensation implant matches this characteristic by reducing the threshold voltage more for longer channel lengths and less for shorter channel lengths. Further, the self-aligned nature of the compensation implant permits the variation in doping concentration which adjusts the reduction of the threshold voltage. Therefore, the inventive compensation implant tends to maintain the threshold voltage of semiconductor devices closer to the target threshold voltage because the compensation implant lowers the threshold voltage of devices having higher threshold voltages (e.g., longer channel lengths) more than it lowers the threshold voltages of devices which have lower threshold voltages (e.g., shorter channel lengths).

Figure 5:
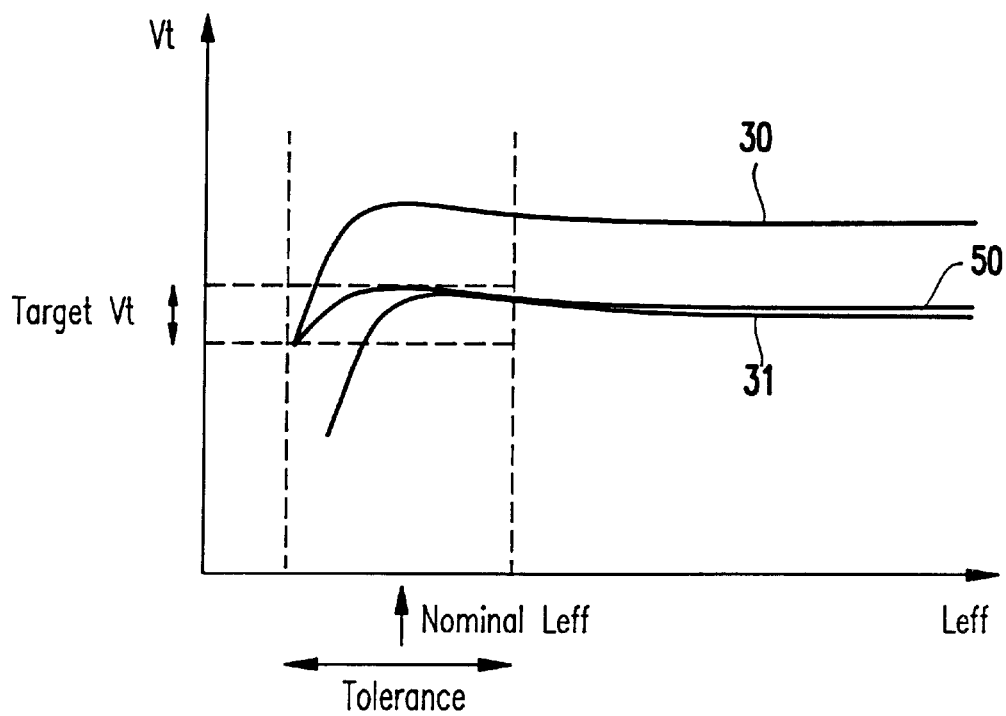
FIG. 5 is a chart showing the relationship between a target threshold voltage and a channel length of a semiconductor device.

This is graphically illustrated in FIG. 5 which is substantially similar to FIG. 3 except for the inclusion of line 50, which represents the threshold voltage of various devices produced with the inventive self-aligned compensation implant. As demonstrated in FIG. 5, throughout the acceptable variations of channel lengths, the devices with the inventive self-aligned compensation implant exhibit a threshold voltage which is within the target threshold voltage range.

Figure 6:
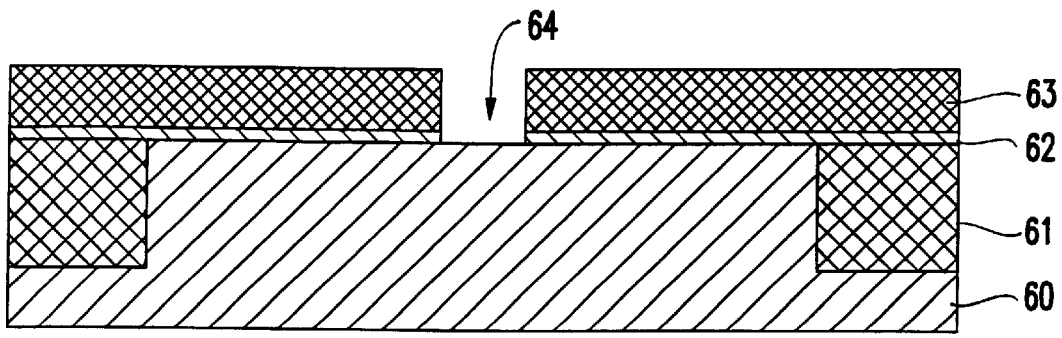
FIG. 6 is a schematic diagram showing a cross-sectional view of a stage of development of a semiconductor device.

A first preferred method for forming the inventive structure, which, for example, could be a damascene gate process, is illustrated in FIGS. 6–11. More specifically, FIG. 6 illustrates the process where a silicon substrate 60 is formed with dielectric areas 61. An oxide layer 62 is formed over the silicon substrate 60. Subsequently a dielectric 63 is formed over the oxide layer 62. A channel 64 is formed through the dielectric layer 63 and the oxide 62, exposing the surface of the substrate 60.

Figure 7:
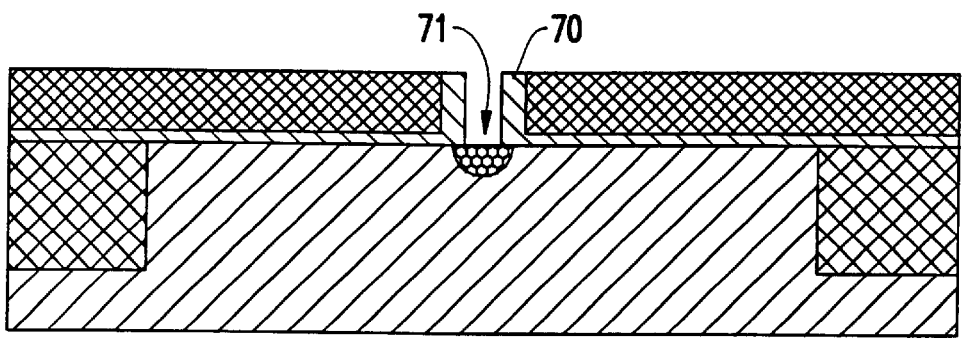
FIG. 7 is a schematic diagram showing a cross-sectional view of a stage of development of a semiconductor device.

Referring to FIG. 7, nitride, oxide or other similar spacers 70, are formed in the channel 64. Subsequently, the inventive self-aligned compensation implant 71 is formed by an impurity implantation through the channel 64. For n-type transistors, the donor impurities could include, for example, phosphorus, arsenic and antimony. For p-type transistors, the donor impurities could include, for example, boron, gallium and indium.

Figure 8:
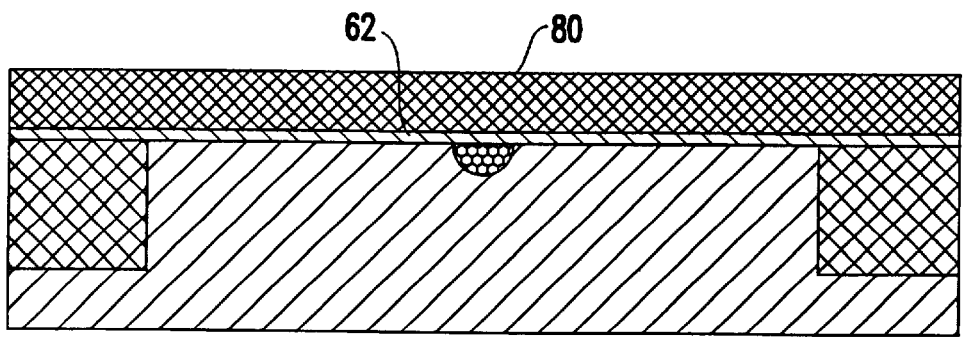
FIG. 8 is a schematic diagram showing a cross-sectional view of a stage of development of a semiconductor device.

In FIG. 8, the self-aligned compensation implant 71 is covered again with the oxide layer 62 and a conductive material 80 (e.g., gate) over the oxide layer 62. The conductive material 80 could include, for example, polysilicon or metal.

Figure 9:
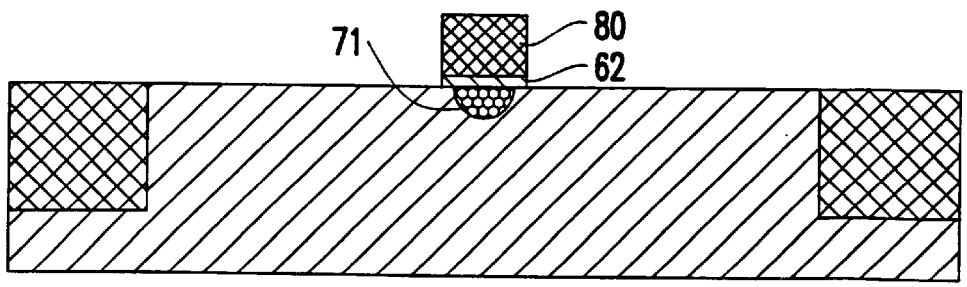
FIG. 9 is a schematic diagram showing a cross-sectional view of a stage of development of a semiconductor device.

With respect to FIG. 9, the dielectric layer 63 and the oxide layer 62 are etched (except for the portion of the oxide layer 62 beneath the conductive layer 80). For example, the etching process could include wet or dry chemical etching.

Figure 10:
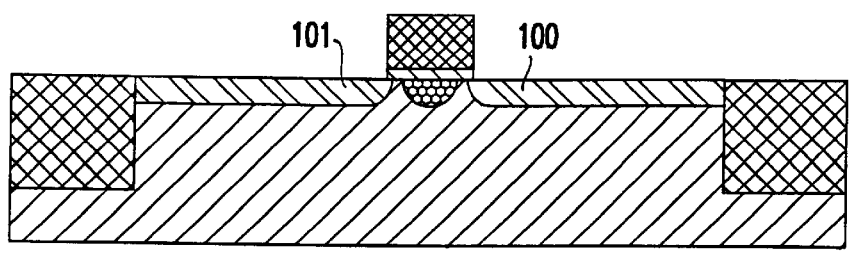
FIG. 10 is a schematic diagram showing a cross-sectional view of a stage of development of a semiconductor device.

Referring to FIG. 10 the source/drain extension implant 100, 101 is illustrated. The source/drain extension implant 100, 101 could utilize the same impurity material used for the self-aligned compensation implant 71.

Figure 11:
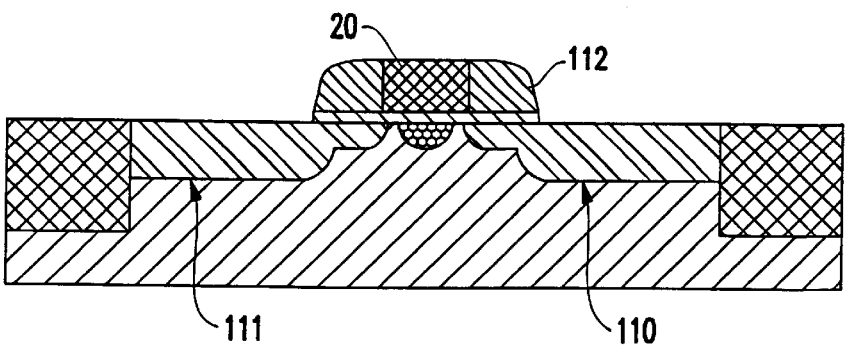
FIG. 11 is a schematic diagram showing a cross-sectional view of a stage of development of a semiconductor device.

FIG. 11 shows the more heavily doped source 110 and drain regions 111, which are formed in a second heavier doping step. Additionally, oxide spacers 112 are formed adjacent the gate layer 80.

FIGS. 6–11 illustrate a process in which the compensation implant 71 is self-aligned with the gate 80 by the channel 64. The channel 64 defines the location of the compensation implant 71, the gate oxide layer 62 and the gate 80. Further, the gate 80 defines the source and drain regions 110, 111. Therefore, since the position of all elements of the transistor are defined by the location and length of the channel 64, the compensation implant 71 will automatically be aligned beneath the gate 80 and will be equally spaced between the source of 110 and the drain 110 regions.

As discussed above, by having a self-aligned compensation implant 71, the dose of impurity within the compensation implant 71 is controlled by the length of the channel 64. Therefore, a longer channel 64 will allow a higher impurity dosage to be implanted in the compensation implant 71. Similarly, a shorter channel length will reduce the doping of the compensation implant. As mentioned above, reducing the amount of impurity doping limits the reduction of the threshold voltage. Further, the thickness of the spacer 70 can also be used in a similar way to optimize the dose and energy of the implant.

Figure 12:
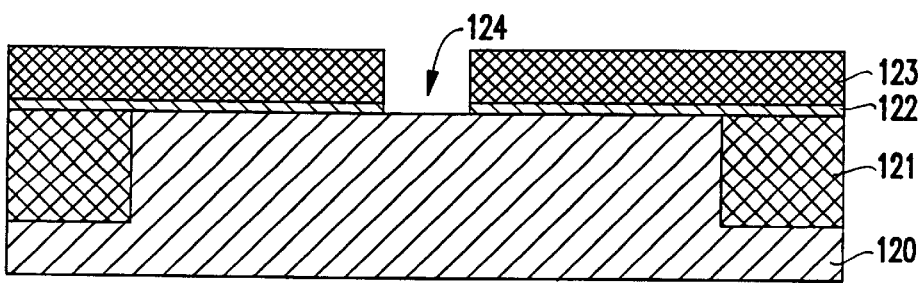
FIG. 12 is a schematic diagram showing a cross-sectional view of a stage of development of a semiconductor device.
Figure 13:
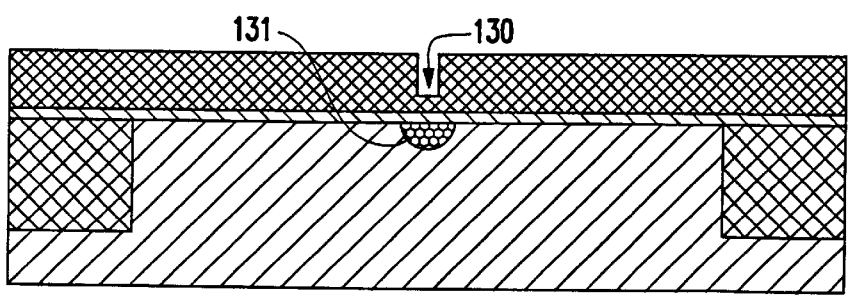
FIG. 13 is a schematic diagram showing a cross-sectional view of a stage of development of a semiconductor device.
Figure 14:
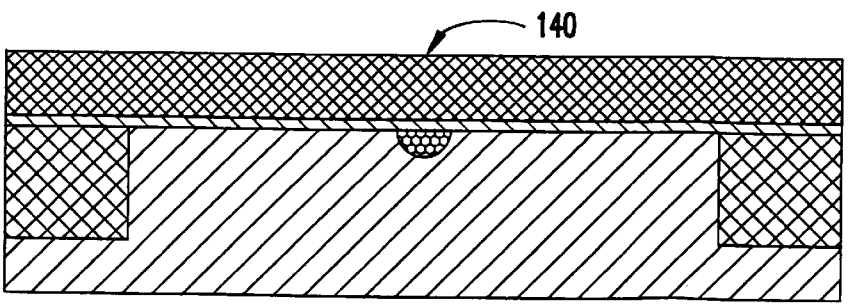
FIG. 14 is a schematic diagram showing a cross-sectional view of a stage of development of a semiconductor device.

In FIGS. 12–14 another preferred method of the invention is illustrated. More specifically, the method illustrated in FIGS. 12–14 is similar to the method illustrated in FIGS. 6–11. However, FIGS. 12–14 illustrate a more efficient method of forming the compensation implant.

More specifically, in a similar manner as discussed above with respect to FIG. 6, a silicon substrate 120 includes dielectric areas 121 and has an oxide layer 122 formed above the silicon substrate 120 and a dielectric layer 123 formed over the gate oxide layer 122. A channel 124 is formed through the dielectric layer 123 and the oxide layer 122, exposing the substrate 120.

As shown in FIG. 13, the channel 124 is partially filled with a conducting material 130, such as metal or polysilicon. Unlike the process shown in FIG. 7, no spacers are formed in FIG. 12. Further, the compensation implant 131 is formed by making the conductive layer 130 thin enough to allow an ion implantation to pass. Therefore, in this preferred embodiment, the impurity is implanted directly through the conductive layer 130. In this way, this embodiment is more efficient than the previous embodiment because the steps of forming the nitride spacers 70 (shown in FIG. 7) is eliminated. Further, such a structure minimizes oxidation and enhances diffusion.

As shown in FIG. 14, the remainder of the channel 124 which was not completely filled by the first layer of conductive material 130 is filled completely with more of the conductive material 140. The structure is then substantially similar to that shown in FIG. 8 and the processing shown in FIGS. 9–11 is completed on the structure illustrated in FIG. 14, as discussed above.

FIGS. 15–20 illustrate the advantages produced by the self-aligned compensation implant. FIGS. 15–20 follow essentially the same method discussed above with respect to FIGS. 6–11. Thus, many of the details have been omitted from FIGS. 15–20 to clearly illustrate how the doping concentration of the self-aligned compensation implant is controlled by the channel length.

More specifically, FIG. 15 illustrates a structure similar to that shown in FIG. 6, having a dielectric/oxide layer 151 above a substrate 150. The dielectric layer has two channels, 152, 153 formed therein. However, because of manufacturing variations, the lengths of the channels 152, 153 are different. In this example, both channels are considered to have been produced within normal manufacturing tolerances.

FIG. 16 illustrates spacers 160, 161 which respectively line the channels 152, 153, in a similar manner as discussed above with respect to FIG. 7. However, while spacers 160 only line the channel 152, spacers 161 fill the channel 161.

FIG. 17 illustrates an ion implantation 170, which is similar to the implantation 71, shown in FIG. 7. However, FIG. 17 illustrates that the compensation implant 171 is formed only below channel 152 and is not formed in channel 153 because the spacers 161 block the implant.

FIGS. 18 and 19 illustrates the formation of the gates 180, 181, as discussed above with respect to FIGS. 8 and 9 and FIG. 20 illustrates the extension/drain implant 200 which is similar to the implant discussed above with respect to FIG. 10.

Therefore, as shown in FIGS. 15–20, the length of the channel controls the doping concentration of the compensation implant 171 by limiting the opening (e.g., 152, 153) through which the impurity 170 may travel. The impurity concentration is adjusted in this manner to completely prevent the ion implantation, to severely limit ion implantation or to increase ion implantation.

Further, the self-aligned nature of the compensation implant 171 automatically compensates for manufacturing variations by basing the impurity concentration based on the length of the channel, as discussed above.

FIGS. 21–24 similarly demonstrate the advantages of the self-aligned compensation implant and illustrate another embodiment of the invention. More specifically, FIGS. 21–24 illustrate a method of utilizing the channel lengths to control the impurity concentration of the compensation implant.

FIG. 21 illustrates a substrate 210, source and drain regions 211, and sacrificial masks 212. The sacrificial masks 212 are formed to occupy space that will eventually become the conductive gates 240 (FIG. 24). Once again, acceptable variations in manufacturing tolerances are illustrated in the differences in the lengths of the sacrificial masks 212. As with the previous embodiments, these variations will be automatically compensated for by the self-aligned nature of the compensation implant.

In FIG. 22, the spacers 220 are formed adjacent the masks 212 in a similar manner as the spacers 112, shown in FIG. 11, were formed adjacent the conductive gate 80.

In FIG. 23, the sacrificial masks 212 have been partially etched to create openings 230, 231 to allow the compensation implant 232 to be formed by impurity implant 233. More specifically, the etching of the sacrificial masks 212 is halted before all the sacrificial ask material has been removed.

Again, depending upon the variation within the manufacturing process, different sized sacrificial masks will be formed which causes different sized openings 230, 231 in the sacrificial masks to form during the partial etch of the sacrificial material. Therefore, different sized openings 230, 231 allow differing concentrations of impurity to be implanted in the compensation implant 232. In the example shown in FIG. 23, only one of the openings (e.g., 230) will receive the compensation implant 233 because the opening 231 in the sacrificial mask did not fully form. However, as discussed above, the impurity concentrations of the compensation implants can vary from a heavy implant, light implant to no implant.

After the doping process and the formation of the compensation implants, the remainder of the sacrificial masks 212 are removed and the gates 240 are formed, as shown in FIG. 24. More specifically, the gates 240 are selectively deposited, using processes well known to those ordinarily skilled in the art, in the openings between the spacers 220. As with the gates discussed in the previous embodiments, the gates preferably comprise a conductive material, such as metal or polysilicon.

FIGS. 21–24 again illustrate that the impurity concentrations of the compensation implants are automatically varied depending upon the channel length because the compensation implants are self-aligned. Therefore, the compensation implants adjust the amount by which the threshold voltage is reduced depending upon the channel length.

By matching the reduction in threshold voltage to the channel length, the invention substantially eliminates the short channel effect for devices having channel lengths as low as 0.05 $\mu$m.

Thus, with the invention, a channel length which is in the upper range of manufacturing tolerances, which would normally exhibit an increase in threshold voltage will be matched with a more heavily doped compensation implant. As discussed above, the heavier doped compensation implant will cause a larger reduction in threshold voltage and, therefore, counterbalance the increased threshold voltage associated with the larger channel length.

Similarly, a channel length which is in the lower range of manufacturing tolerances, which would normally exhibit less of an increase in threshold voltage will be matched with a less heavily doped compensation implant. As discussed above, the lighter doped compensation implant will cause a smaller reduction in threshold voltage and, therefore, counterbalance the smaller increase in threshold voltage associated with the smaller channel length.

Therefore, the self-aligned nature of the inventive compensation implant permits devices having channel lengths as small as 0.05 $\mu$m to be produced which do not suffer the adverse effects of threshold voltage roll-off.

While the invention has been described in terms of preferred embodiments, those skilled in the art will recognize that the invention can be practiced with modification within the spirit and scope of the appended claims.

I claim:

1. A plurality of semiconductor devices, each semiconductor device comprising:
   conductive regions;
   a gate between said conductive regions; and
   a non-uniform compensation implant below said gate,
   wherein, for each of said semiconductor devices, a doping concentration of said compensation implant is controlled by an actual length of said gate, and wherein said actual length of said gate varies within a manufacturing process window of a single gate design size for all of said semiconductor devices.

2. The semiconductor device as in claim 1, wherein said semiconductor device has an approximately 0.05 µm channel length.

3. The semiconductor device as in claim 1, wherein said doping concentration controls a threshold voltage of said semiconductor device.

4. The semiconductor device as in claim 1 wherein said length of said gate controls a threshold voltage of said semiconductor device.

5. The semiconductor device as in claim 1, wherein said compensation implant is aligned with said gate.

6. The semiconductor device as in claim 1, further comprising:
   a ring-shaped halo implant around said compensation implant, wherein said conductive regions are outside said halo implant.

7. A plurality of semiconductor devices, each semiconductor device comprising:
   a gate;
   an oxide layer below said gate;
   a non-uniform compensation implant below said oxide layer;
   a ring-shaped halo implant around said compensation implant below said oxide layer; and
   gate and drain regions outside said halo implant and below said oxide layer,
   wherein said compensation implant has a doping concentration for controlling a threshold voltage reduction of said semiconductor device that is controlled by an actual channel length of said semiconductor device, and wherein said actual channel length varies within a manufacturing process window of a single channel length design size for all of said semiconductor devices.

8. The semiconductor transistor as in claim 7, wherein said length of said gate controls a threshold voltage of said semiconductor device.

9. The semiconductor device as in claim 7, wherein said semiconductor device has an approximately 0.05 µm channel length.

10. A semiconductor transistor comprising:
    source and drain regions;
    a gate between said source and drain regions; and
    a non-uniform compensation implant below said gate,
    wherein, for each of said semiconductor devices, a doping concentration of said compensation implant is controlled by an actual length of said gate, and wherein said actual length of said gate varies within a manufacturing process window of a single gate design size for all of said semiconductor devices.

11. The semiconductor transistor as in claim 10, wherein said semiconductor device has an approximately 0.05 µm channel length.

12. The semiconductor transistor as in claim 10, wherein said length of said gate controls a threshold voltage of said semiconductor device.

13. The semiconductor transistor as in claim 10, wherein said doping concentration of said compensation implant controls a threshold voltage of said semiconductor device.

14. The semiconductor transistor as in claim 10, wherein said compensation implant is aligned with said gate.

15. The semiconductor device as in claim 1, wherein an impurity concentration of said compensation implant is proportional to said length of said gate.

16. The semiconductor device as in claim 1, wherein manufacturing variations in said length of said gate within a given processing window change said doping concentration of said compensation implant.

17. The semiconductor device as in claim 1, wherein a physical relationship exists between said length of said gate and said doping concentration of said compensation implant, such that an increase in said length of said gate within a given processing window increases said doping concentration of said compensation implant and a decrease in said length of said gate within a given processing window decreases said doping concentration of said compensation implant.

18. An array of semiconductor transistors comprising:
    a plurality of gates, each associated with one of said transistors, wherein all of said gates have a single design size and have an actual size that will vary within a predetermined manufacturing processing window of said design size; and
    a non-uniform compensation implant below each of said gates, wherein a doping concentration of said compensation implant varies from gate to gate according to said actual size of each of said gates.

19. The array in claim 18, wherein said doping concentration of said compensation implant is proportional to said actual size of said gate.

20. The array in claim 18, wherein a physical relationship exists between said actual size of said gate and said doping concentration of said compensation implant, such that an increase in said actual size of said gate within said manufacturing processing window increases said doping concentration of said compensation implant and a decrease in said actual size of said gate within said manufacturing processing window decreases said doping concentration of said compensation implant.

* * * * *